(12) United States Patent
Wu et al.

(10) Patent No.: US 7,622,931 B2
(45) Date of Patent: Nov. 24, 2009

(54) NON-CONTACT REFLECTOMETRY SYSTEM AND METHOD

(75) Inventors: Shang Wu, Salt Lake City, UT (US); Cynthia Furse, Salt Lake City, UT (US); Chet Lo, Salt Lake City, UT (US)

(73) Assignee: University of Utah Research Foundation, Salt Lake City, UT (US)

( * ) Notice: Subject to any disclaimer, the term of this patent is extended or adjusted under 35 U.S.C. 154(b) by 434 days.

(21) Appl. No.: 11/543,245

(22) Filed: Oct. 3, 2006

(65) Prior Publication Data

US 2007/0085550 A1  Apr. 19, 2007

Related U.S. Application Data

(60) Provisional application No. 60/723,545, filed on Oct. 3, 2005.

(51) Int. Cl.
*G01R 31/08* (2006.01)
(52) U.S. Cl. .................. 324/534; 324/527; 324/535
(58) Field of Classification Search ................ 324/519, 324/527, 534, 535
See application file for complete search history.

(56) References Cited

U.S. PATENT DOCUMENTS

| | | | |
|---|---|---|---|
| 1,297,929 A | 3/1919 | Taylor | |
| 2,717,992 A | 9/1955 | Weintraub | |
| 3,792,350 A | 2/1974 | Bossler et al. | |
| 3,798,541 A | 3/1974 | Campbell, Jr. et al. | |
| 3,831,086 A | 8/1974 | Pesto | |
| 4,325,022 A | 4/1982 | Pelletier | |
| 4,330,749 A | 5/1982 | Eda et al. | |
| 4,438,389 A | 3/1984 | De Sa | |
| 4,801,866 A | 1/1989 | Wixley | |
| 4,928,057 A | 5/1990 | Williams | |
| 5,218,294 A | 6/1993 | Soiferman | |
| 5,274,336 A | 12/1993 | Crook et al. | |
| 5,420,500 A | 5/1995 | Kerschner | |
| 5,444,364 A | 8/1995 | Satterwhite et al. | |
| 5,517,110 A | 5/1996 | Soiferman | |
| 5,557,209 A | 9/1996 | Crook et al. | |
| 5,696,451 A | 12/1997 | Keirn et al. | |
| 5,703,928 A | 12/1997 | Galloway et al. | |
| 5,995,588 A | 11/1999 | Crick | |
| 6,201,398 B1 | 3/2001 | Takada | |
| 6,373,258 B2 | 4/2002 | Takada | |
| 6,411,108 B1 | 6/2002 | Douglas et al. | |
| 6,529,006 B1 | 3/2003 | Hayes | |
| 6,759,850 B2 | 7/2004 | Harzanu et al. | |
| 6,868,357 B2 | 3/2005 | Furse | |
| 7,075,309 B2 * | 7/2006 | Smith | 324/534 |
| 2002/0180455 A1 | 12/2002 | Okano et al. | |
| 2003/0125893 A1 * | 7/2003 | Furse | 702/108 |
| 2004/0101130 A1 * | 5/2004 | Shi et al. | 379/399.01 |
| 2005/0046428 A1 | 3/2005 | Tesdahl et al. | |
| 2005/0194978 A1 * | 9/2005 | Smith | 324/527 |

* cited by examiner

*Primary Examiner*—Timothy J Dole
(74) *Attorney, Agent, or Firm*—Kirton & McConkie; William T. Ralston

(57) ABSTRACT

Non-contact reflectometry for testing a signal path is described. The technique includes using capacitive coupling to inject a test signal into the signal path and extract a response signal from the signal path. Reflectometry techniques are used to determine characteristics of the signal path from the response signal. The technique is compatible with performing testing of a signal path carrying an operational signal.

20 Claims, 9 Drawing Sheets

NON-CONTACT REFLECTOMETRY SYSTEM AND METHOD

This application claims the benefit of U.S. Provisional Patent Application Ser. No. 60/723,545 filed Oct. 3, 2005, entitled "Non-Contact Reflectometry System and Method" which is hereby incorporated by reference.

FIELD OF THE INVENTION

The present invention relates generally to probes for electronic testing. More particularly, the present invention relates to probes for use with reflectometry instruments.

BACKGROUND

Reflectometry is an effective technique for testing and fault location in wires and cables, referred to herein generally as signal paths. Typically, reflectometry involves injecting a test signal into the signal path and analyzing the reflected signal that returns from the signal path. For example, reflections will be generated by short circuits, open circuits, or other impedance discontinuities in the signal path, and may be indicative of a fault. By analyzing the reflected signal, information about the signal path can be obtained. For example, based on the time delay between an injected pulse and a reflected pulse, the distance to a fault can be determined. There are a variety of reflectometry techniques on the market and under development, each with its own unique advantages and disadvantages.

One disadvantage common to many techniques is the requirement that a direct connection be made to the signal path under test. By direct connection is meant that the probe is placed in physical contact with the signal path to create an electrical connection. Direct connection may be made, for example, by removing insulation from an insulated wire to allow a probe to be electrically connected to the internal conductor, disconnecting a connector and plugging a probe into the connector, or disconnecting a wire from a circuit and connecting it to the probe. The requirement for direct connection has various disadvantages.

The removal of insulation can cause damage to the wire, and the insulation may need to be repaired at the completion of testing. While damage may be avoided when direct connection is made by unplugging a wire at a connector location and touching the probe to the exposed conductor of the wire at the plug, repeated disconnect/connect cycles can be damaging to some connectors. Disconnecting/reconnecting connectors and manipulating wires also carries a risk of causing additional failures. In general, direct connection can threaten the integrity of the signal path.

Direct connection is also generally incompatible with performing live testing. By live testing is meant conducting reflectometry tests while the signal path is being used to carry operational signals within a system. Operational signals are those used by the system for performing its primary mission, unrelated to reflectometry test. Some kinds of faults, for example, arc faults, are intermittent and may only appear when a system is operational. In such cases, removing insulation can be hazardous, for example, when high voltages are present or an accidental short circuit would be destructive. Unplugging connectors is also incompatible with testing an operational system, since it causes a break in the signal path. Even if connectors are reattached during testing, this type of invasive procedure may result in recertification of the system being required for many electrical applications, such as testing aircraft circuits.

SUMMARY OF THE INVENTION

It has been recognized that it would be advantageous to develop a technique for non-contact insertion and extraction of reflectometry test signals in and out of a signal path to enable remote detection of wire faults and measurement of wire electrical properties.

In one embodiment, a method of non-contact reflectometry testing of a signal path may include generating a test signal, capacitively coupling the test signal into the signal path at a first point, capacitively coupling a response signal out of the signal path at a second point, and determining a characteristic of the signal path from the response signal using reflectometry techniques.

Additional embodiments, features and advantages of the invention will be apparent from the detailed description which follows, taken in conjunction with the accompanying appendix, which together illustrate, by way of example, features of the invention.

DETAILED DESCRIPTION

Figure 1:
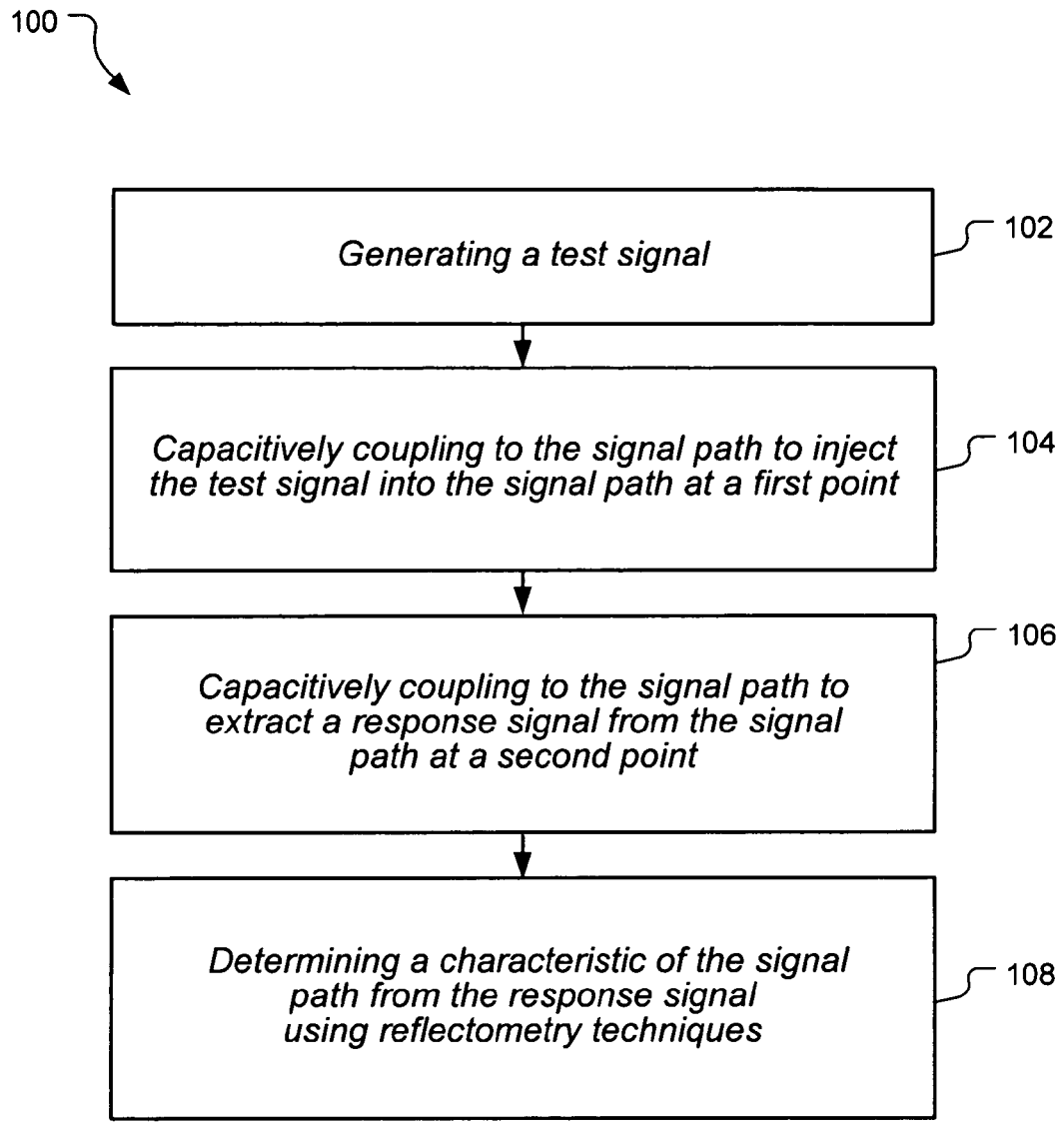
FIG. 1 is a flow chart of a method of non-contact reflectometry testing of a signal path in accordance with an embodiment of the present invention.

In describing the present invention, the following terminology will be used:

The singular forms "a," "an," and "the" include plural referents unless the context clearly dictates otherwise. Thus, for example, reference to a probe includes reference to one or more probes.

As used herein, the term "about" means quantities, dimensions, sizes, formulations, parameters, shapes and other characteristics need not be exact, but may be approximated and/or larger or smaller, as desired, reflecting acceptable tolerances, conversion factors, rounding off, measurement error and the like and other factors known to those of skill in the art.

As used herein, a plurality of items may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Reference will now be made to the exemplary embodiments illustrated in the drawings, and specific language will be used herein to describe the same. It will nevertheless be understood that no limitation of the scope of the invention is thereby intended. Alterations and further modifications of the inventive features illustrated herein, and additional applications of the principles of the inventions as illustrated herein, which would occur to one skilled in the relevant art and having possession of this disclosure, are to be considered within the scope of the invention.

In one embodiment, as illustrated in FIG. 1, the invention includes a method 100 of non-contact reflectometry testing of a signal path. The method can include the step of generating 102 a test signal. For example, the test signal may be a reflectometry test signal such as a pulse as used in time domain reflectometry, a sine wave as used in frequency domain reflectometry, a spread spectrum signal as used in spread spectrum time domain reflectometry, or similar techniques.

The method can include the steps of capacitively coupling 104 to the signal path to inject the test signal into the signal path at a first point, and capacitively coupling 106 to the signal path to extract a response signal from the signal path at a second point. The response signal may include reflections of the test signal, for example, caused by breaks, short circuits, or other impedance discontinuities in the signal path.

The method can also include the step of determining 108 a characteristic of the signal path from the response signal using reflectometry techniques. For example, characteristics can include distance to an open or short circuit, impedance, or other characteristics that can be measured using reflectometry techniques.

It should be appreciated that the first point and the second point may be the same point on the signal path, or may be different points. For example, the first point may be at beginning of a wire (e.g., at a circuit component, circuit board, connector, or the like) and the second point may be at the end of a wire. As another example, the first point and second point may be substantially collocated in that they are placed at approximately the same point on the wire, for example, as close as physically possible, or close enough that the distance separation is below a resolution capability of the reflectometry technique being used.

Because the test signal and response signal are injected using capacitive coupling, there may be frequency response effects which cause distortion to the test signal and/or response signal. Accordingly, the method may include compensating for frequency response effects caused by the capacitive coupling as discussed further below.

Figure 2:
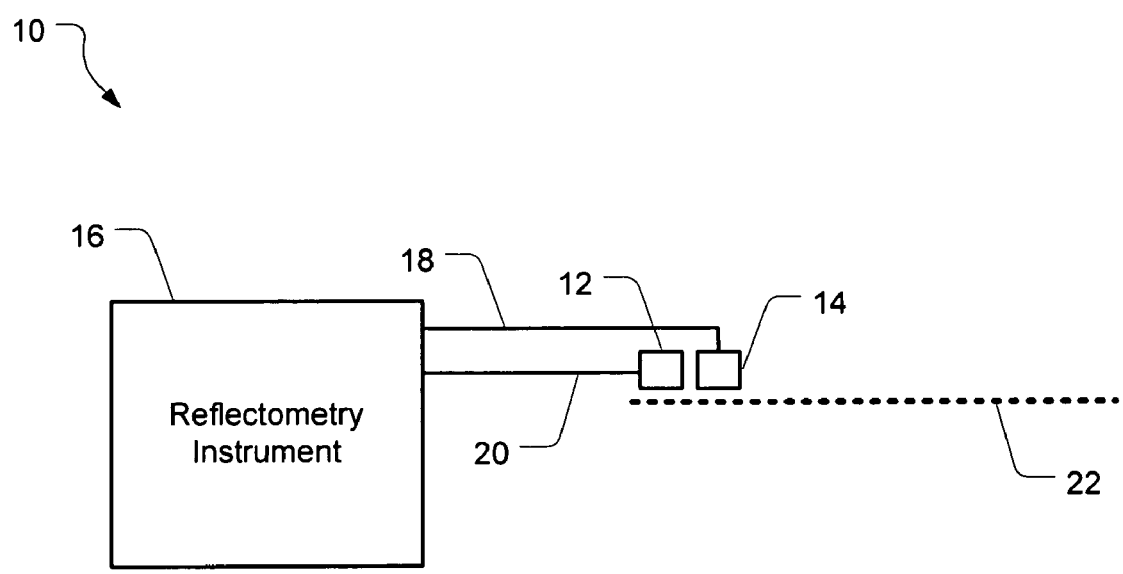
FIG. 2 is a block diagram of a non-contact reflectometry system in accordance with an embodiment of the present invention.

As illustrated in FIG. 2, a system, indicated generally at 10, in accordance with an embodiment of the present invention is shown for non-contact reflectometry testing of a signal path. The system includes an injection probe 12. When the injection probe is placed in proximity to the signal path 22, it injects a test signal 20 into the signal path via capacitive coupling. The system also includes an extraction probe 14. When placed in near proximity to the signal path, the extraction probe extracts a response signal 20 from the signal path via capacitive coupling. Coupled to the injection probe and the extraction probe is a reflectometry instrument 16. The reflectometry instrument generates the test signal, accepts the response signal, and determines a signal path characteristic from the response signal.

Figure 3:
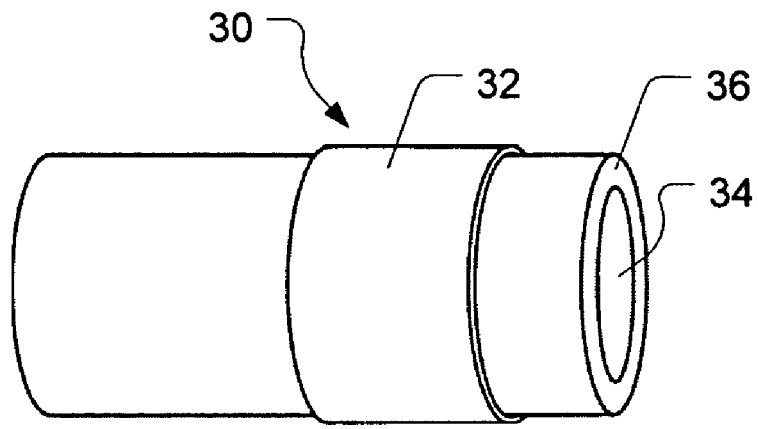
FIG. 3 is a schematic of a capacitively-coupled probe in the form of a concentric cylinder in accordance with an embodiment of the present invention.

Generally speaking, the injection probe 12 and extraction probe 14 can be capacitive couplers. Various configurations of capacitive couplers can be used in embodiments of the present invention. For example, an exemplary capacitive coupler referred to as a concentric cylinder is illustrated in FIG. 3. The concentric cylinder 30 includes a substantially cylindrical conducting body 32 which can be placed to substantially surround a signal path. The signal path is shown here as an insulated wire, having a conductor 34 and insulation 36.

The concentric cylinder can be a circular cylinder, as illustrated in FIG. 3, or can have other cross sections. For example, the concentric cylinder can have a similar shape as the exterior insulation profile of the wire. It is desirable to have the conducting body in close proximity to the insulation, as this helps to increase the capacitive coupling. The conducting body can be formed, for example, from flexible copper tape. As another example, the conducting body can be formed from a conductive elastic tube. As a further example, the conducting body could be metallic tape.

Figure 4:
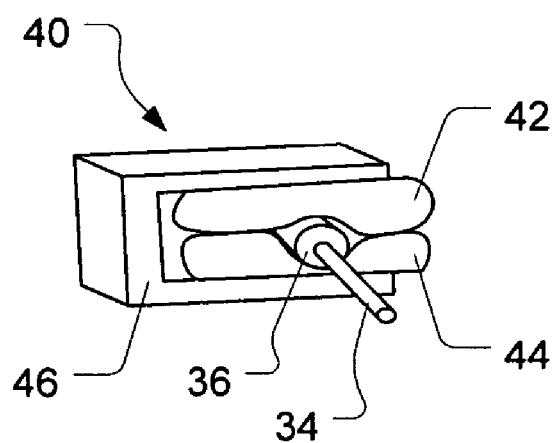
FIG. 4 is a schematic of a capacitively-coupled probe wherein the conducting body is formed of conductive foam in accordance with an embodiment of the present invention.

FIG. 4 illustrates another exemplary embodiment of a capacitive coupler 40, where the conducting body is formed from two portions 42, 44 of conductive foam held onto the wire using a clamp element 46. The conductive foam thus substantially conforms to and surrounds the insulation 36.

Figure 5:
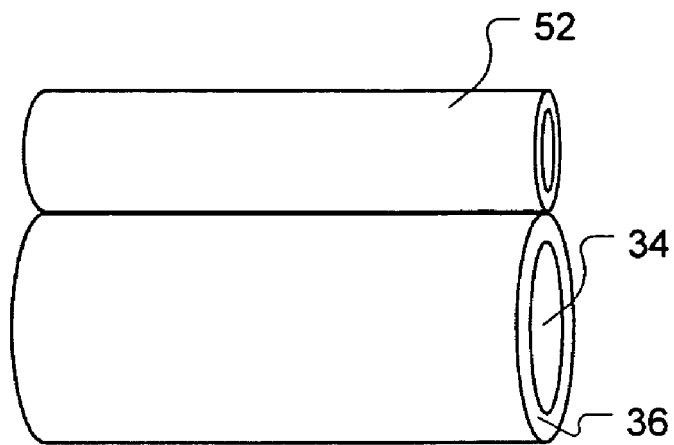
FIG. 5 is a schematic of a capacitively-coupled probe in the form of an extended, substantially linear element in accordance with an embodiment of the present invention.
Figure 6:
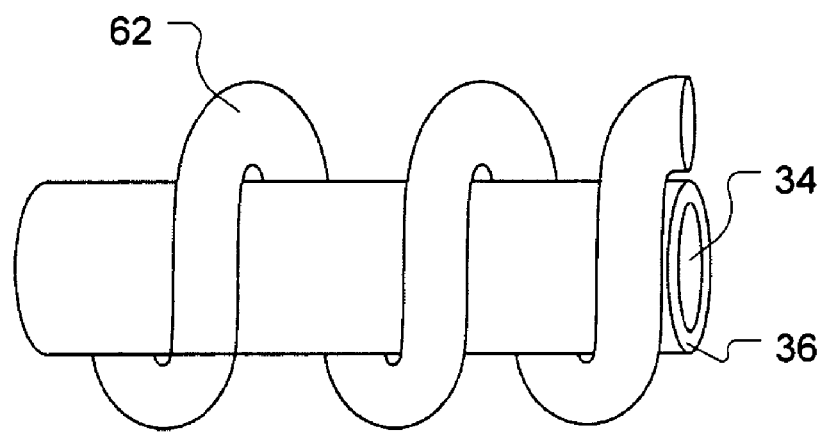
FIG. 6 is a schematic of a capacitive-coupler probe in the form of a flexible spiral element in accordance with an embodiment of the present invention.

Other types of capacitive couplers can also be used. FIG. 5 illustrates a capacitive coupler which is formed of an extended, substantially linear element 52 configured for placement substantially in parallel to the signal path. The linear element can be, for example, an insulated wire or uninsulated wire. An insulated wire is desirable when the signal path is uninsulated, and an uninsulated wire is desirable when the signal path is insulated. FIG. 6 illustrates a capacitive coupler 62 which is formed of a flexible spiral element which can be wrapped around the signal path.

From the above examples, it will be appreciated that other configurations of a capacitive coupler may be used in embodiments of the present invention.

Figure 7:
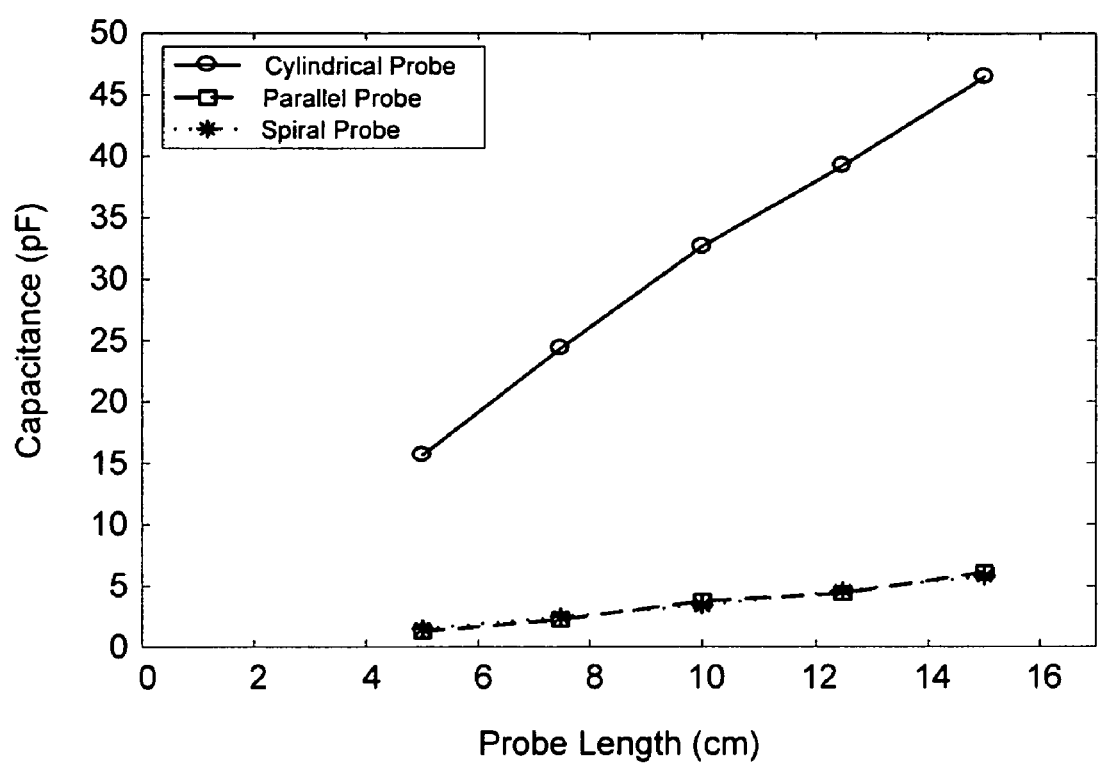
FIG. 7 is a graph of measured capacitance for various probe configurations as a function of the probe length in accordance with embodiments of the present invention.

Operation of a capacitive coupler will now be explained in general terms. Generally, a capacitive coupler can include a conducting body which may be placed adjacent to a signal path. The conducting body is not in direct electrical contact with the signal path, since it is separated by an insulation layer (e.g., insulation on the wire, a cable jacket, or insulating material which is a part of the probe). An electrical capacitance will thus exist between the conducting body and the signal path. This capacitance is a function of the geometry of the conducting body, position relative to the signal path, and properties of the insulation. In particularly, the dielectric constant and permittivity of materials between the conducting body and the signal path have an effect of the resulting capacitance. Various amounts of capacitance can be obtained, the capacitance generally increasing for larger conducting bodies and closer spacing to the signal path. For example, for polyethylene insulated #16 AWG wire with insulation about 0.3 mm thick, a linear probe of about 1 cm length is expected to provide about 0.7 pF of capacitance. A concentric cylinder probe of the same length, due to the larger area of the conducting body, is expected to provide about 3.8 pF of capacitance. A spiral configuration is expected to provide approximately the same capacitance as a linear probe. FIG. 7 provides a graph of measured capacitance for various probe configurations as a function of the probe length. Longer probe lengths generally provide higher capacitance, which can be helpful in providing higher signal levels.

Practically realizable capacitance values tend to be somewhat small, which presents some challenges in using capacitive couplers with existing reflectometry instruments as will now be explained. The coupling capacitance provided by the capacitive coupler may result in the signal that is passed through the capacitive coupler being much smaller than what would be obtained with a direct contact method that uses an isolation capacitor or voltage transformer. Accordingly, it may be beneficial to include amplification in the non-contact reflectometry system to help compensate for this effect. For example, an amplifier can be included to amplify the test signal before injection, to amplify the response signal after extraction, or both.

Figure 8:
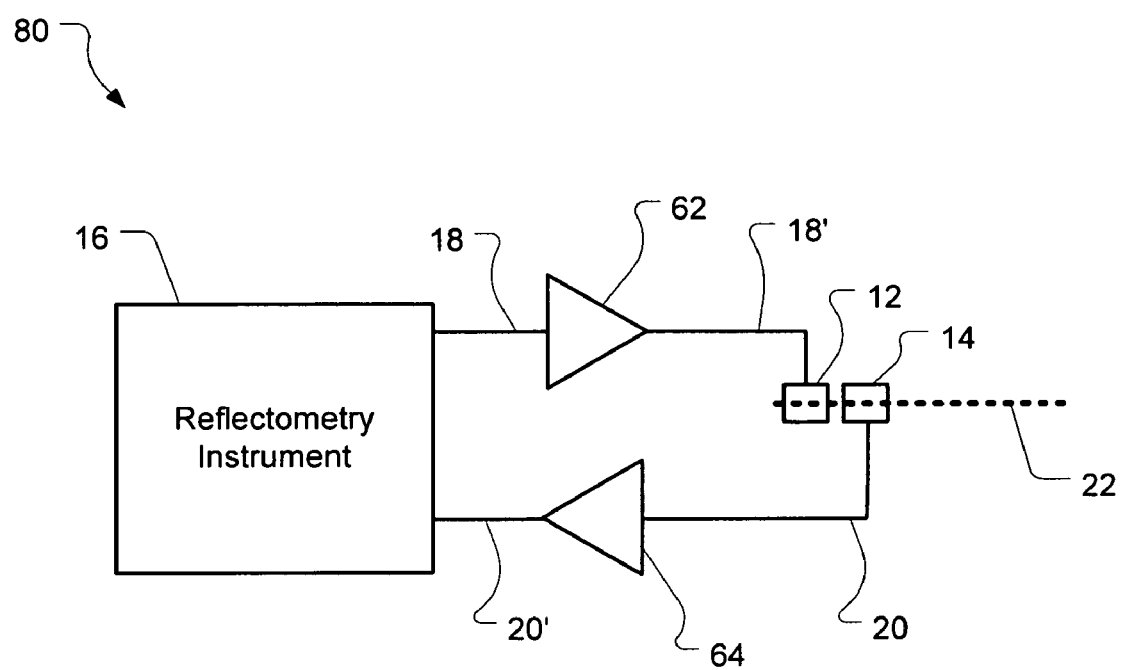
FIG. 8 is a block diagram of a non-contact reflectometry system in accordance with another embodiment of the present invention.

FIG. 8 illustrates an alternate arrangement of a system for non-contact reflectometry testing of a signal path, in accordance with an embodiment of the present invention. The system 80 includes a reflectometry instrument 16 which generates a test signal 18 and accepts a response signal 20, for example as described above. The test signal is passed through a first signal conditioner 62 to produce a conditioned test signal 18' which is applied to an injection probe 12. A response signal 20 is obtained from an extraction probe 14 and passed through a second signal conditioner 64 to produce a conditioned response signal 20' which is applied to the reflectometry instrument.

As noted above, attenuation may occur as signals 18', 20 are passed through the probes 12, 14. Hence, the signal conditioners 62, 64 can be amplifiers or otherwise provide for amplification.

It should also be appreciated that capacitive coupling usually produces a high pass frequency response, causing signals passed through the probes to be distorted. The test signal 18' passes through the injection probe 12, causing distortion as it appears on the signal path. The reflections of the test signal form the response signal, and the response signal is subjected to additional distortion by the extraction probe 14. Accordingly, the net effect is that the response signal has been twice filtered by the capacitive coupling relative to a situation where the test signal is directly injected into the signal path. These affects can be compensated by using low pass filtering, high frequency emphasis, or similar techniques. Accordingly, the signal conditioners 62, 64 may include filtering, emphasis, or similar techniques. As will be appreciated, because the overall system operates in a linear region, compensation can be provided primarily by the first signal conditioner 62, primarily by the second signal condition 64, or by both. In general, compensation may be provided by hardware (e.g., filters) or software (e.g., signal processing software implemented on a specialized or general purpose processor).

As another alternative, compensation may include correcting for baseline errors in the measurement. For example, when use correlation techniques (e.g., sequence time domain reflectometry, spread spectrum time domain reflectometry) certain erroneous peaks may be observed which are caused by correlation sidelobes, noise, or other aspects of the wire. These erroneous peaks may be determined, for example, using a model wire, and subtracted from the results obtained during testing.

The use of capacitive coupling for both injection and extracting provides a benefit in making the system 10 (FIG. 2) easier and less intrusive to use. Because direct connection is avoided, risk of damaging the integrity of the signal path 20 is reduced. Removal of insulation or unplugging connectors can be avoided. In contrast to inductive coupling techniques, the capacitive coupler need not wrap completely around the signal path.

An advantage of using a capacitive coupler is the ease with which the system 10 can be deployed to test a signal path. Steps, such as unplugging connectors or removing insulation, can be avoided, making testing quicker. Another benefit of capacitive coupling is that the probes 12, 14 can be attached or removed at almost any point on an existing system in a relatively unobtrusive manner. For example, a probe formed from thin copper tape can be easily wrapped around a wire signal path, adding little size, cost, or weight to either the testing system or the operational system being testing. Such probes may be left in place indefinitely, for example, to support operational testing. It is also easier to move the probe(s) to test different signal paths.

Another benefit of the capacitive coupler is its mechanical simplicity. Because of the simplicity, the capacitive coupler can be deployed in a harsh environment, making live, operational testing possible. For example, a probe constructed of copper tape can be subjected to high temperature, pressure, and humidity variations which may be experienced by the operational system during normal use, for example as in an aircraft.

The testing system may thus be installed on a permanent basis into the aircraft to allow testing and detection of faults in flight, providing enhanced overall reliability for the aircraft. Very light weight probes can be constructed, making them compatible for use in weight and space constrained environments, such as space or airborne applications.

No power source for the probes is necessary, since they can operate entirely passively. Safety hazards to an operator are reduced, since there is no direct contact to the signal path. The probes can be mass produced simply and inexpensively. When the capacitive coupler is combined with a single chip implementation of the reflectometry instrument, a highly capable, flexible, and cost-effective testing system can be achieved.

Another major advantage of the capacitive probe is that it can be used to replace an isolation capacitor, transformer, or other electrical hardware that is used in reflectometry systems for testing live wires. Such an isolation device is used to protect the reflectometry circuit from the operational signals, and to make it appear to the wire as if the reflectometry circuit does not exist. By using the capacitive coupler to replace an electronic isolation device, the part count of the system can be reduced.

Figure 9:
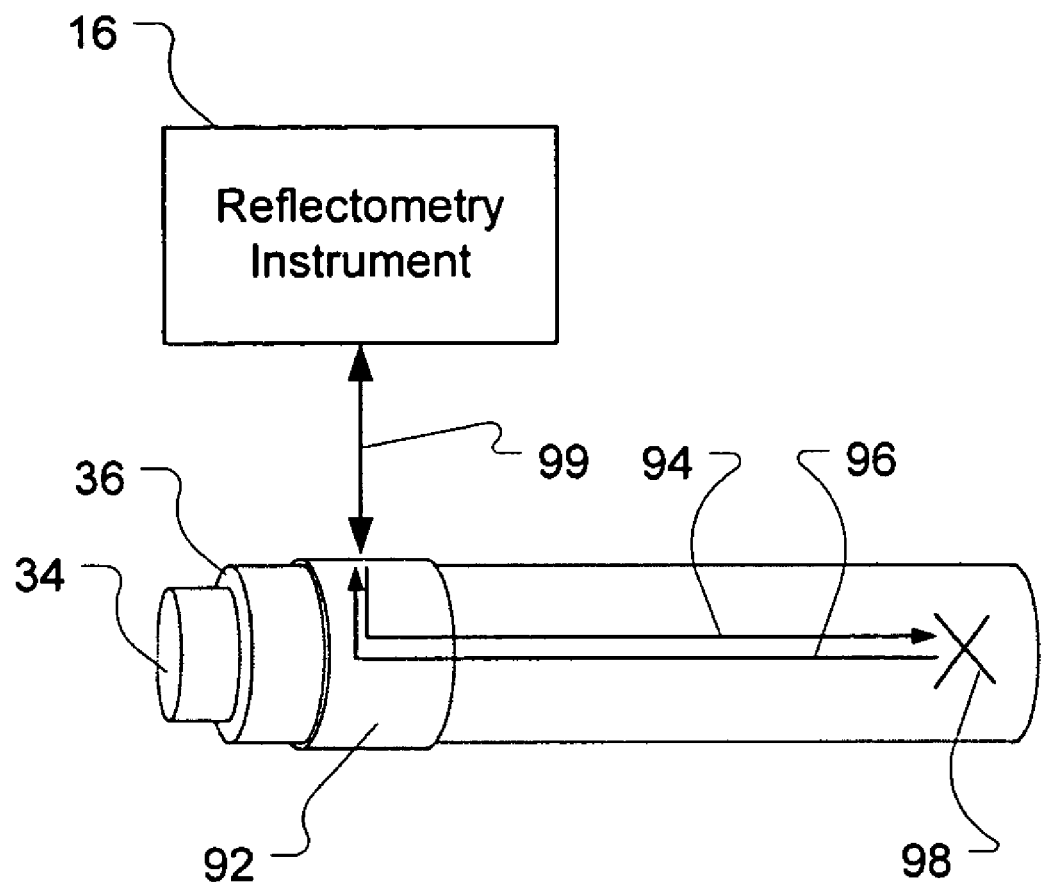
FIG. 9 is a schematic diagram of an alternate configuration of a capacitively-coupled probe in accordance with an embodiment of the present invention.
Figure 10:
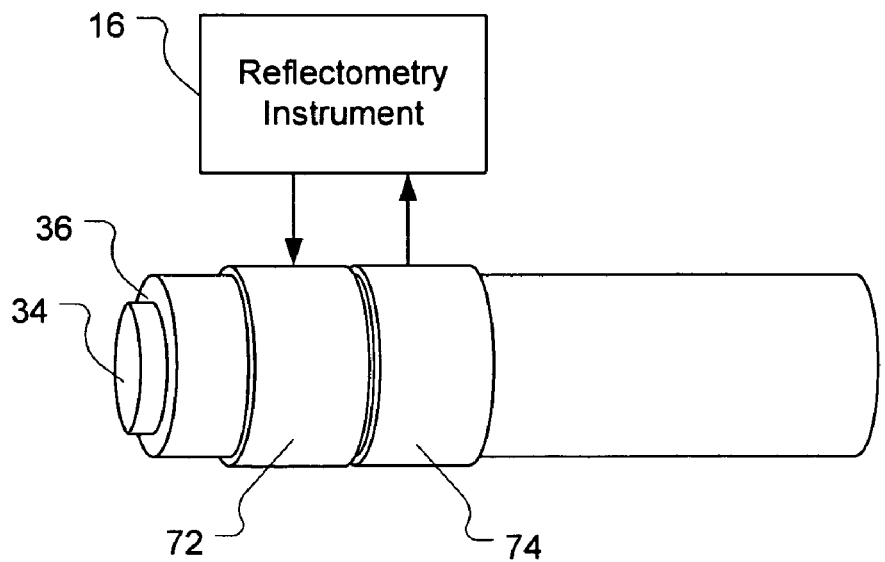
FIG. 10 is a schematic diagram showing placement of capacitive couplers in accordance with an embodiment of the present invention.
Figure 11:
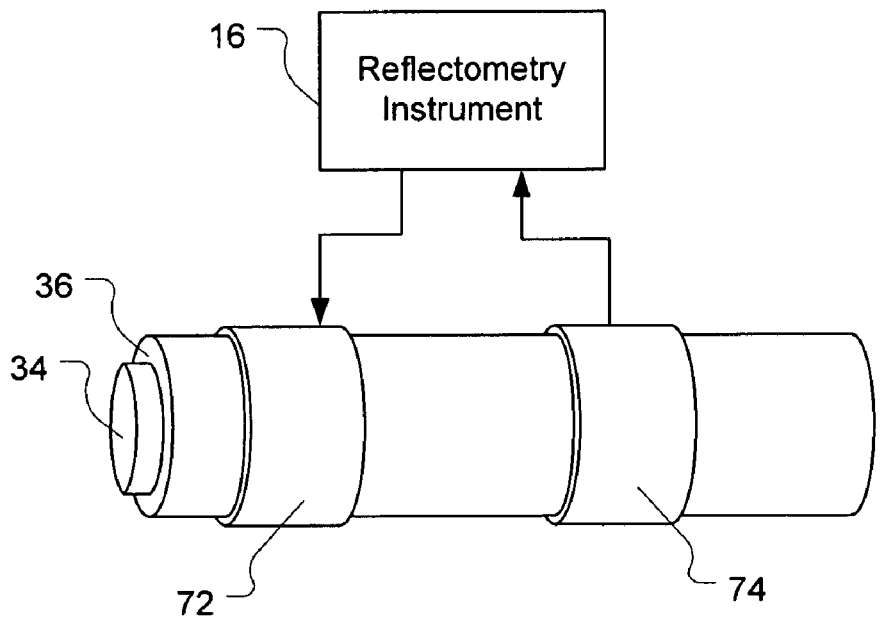
FIG. 11 is a schematic diagram showing alternate placement of capacitive couplers in accordance with an embodiment of the present invention.

The discussion to this point has principally focused on using a physically separate injection probe 12 and extraction probe 14. As an alternative, a single probe, e.g. a capacitive coupler, can be used for both injection and extraction. FIG. 9 illustrates an alternate configuration using a single capacitive coupler 92 for injection of a test signal 94 and extraction of the response signal 96. The response signal is formed from a reflection from an anomaly 98 in the wire, for example, an impedance discontinuity, short, or open. The extracted signal 99 will thus be the response signal superimposed onto the test signal. This configuration can be used, for example with a time domain reflectometer, as interference between the test signal and response signal can be avoided by using a short pulse. This configuration can also be used with mixed signal reflectometers, sequence time domain reflectometers, spread spectrum reflectometers, and other instruments As discussed above, separate injection probe 72 and extraction probe 74 can be used and placed near each other, for example at the end of a wire, so they are substantially collocated as illustrated in FIG. 10. Alternately, the injection and extraction probes can be placed at different places on the wire, for example as illustrated in FIG. 11. As another example, the injection probe can be placed at the beginning of a wire, and the extraction probe placed at the end of a wire. The placement of the probes can be taken into account in the reflectometer instrument.

As noted above, various types of reflectometers can be used in embodiments of the present invention. For example, the reflectometry instrument 16 can be a time domain reflectometer, standing wave reflectometer, or sequence time domain reflectometer as known in the art. As other examples, the reflectometry instrument can be a frequency domain reflectometer, for example, as illustrated in U.S. Pat. No. 6,868,357 to Cynthia Furse entitled "Frequency Domain Reflectometry System for Testing Wires and Cables Utilizing In-Situ Connectors, Passive Connectivity, Cable Fray Detection, and Live Wire Testing." As other example, the reflectometry instrument can be a spread spectrum reflectometer, for example, as described in PCT Patent Application Publication No. WO2004/070398 to Cynthia Furse et al. entitled "Method and Apparatus for Characterizing a Signal Path Containing an Operational Signal." As yet another example, the reflectometry instrument can be a mixed signal reflectometer, for example, as described in WO2004/091105 to Cynthia Furse et al. entitled "Apparatus and Method for Testing a Signal Path from an Injection Point." As yet another example, the reflectometry instrument can be a noise domain reflectometer, for example, as described in PCT Patent Application Publication No. WO 2004/084033 to Cynthia Furse et al. entitled "Method and System for Testing a Signal Path Having an Operational Signal." Each of these publications is incorporated herein by reference in their entirety for all purposes.

As discussed in the above referenced publications, some reflectometry instruments can accommodate testing when an operational signal is present in the signal path. Accordingly, testing with the system 10 can be performed while an operational signal is present in the signal path 22. Accordingly, the system can optionally be installed permanently at a location within an operational system containing the signal path. For example, the system can be integrated into a connector, circuit breaker box, junction box, cable breakout box, electronic subsystem, and the like.

As discussed in the above publications, the reflectometry instrument 16 can be used to determine characteristics of the signal path. Such characteristics can include, for example, distance to an anomaly in the signal path. Anomalies can include, for example, a short circuit, open circuit, impedance discontinuity, cable fray, etc. As another example, impedances of the signal path can be measured. As yet another example, measurement information obtained from the reflectometry instrument can be further processed in combination with known characteristics of the signal path. As one example, a measurement obtained during live operation can be compared with a previously obtained measurement to detect changes in conditions indicative of a failure. As another example, a previously obtained measurement can be used for calibration, compensation, or baseline purposes.

In one embodiment, the reflectometry instrument 16 may determine the signal path characteristic by correlating the test signal against the response signal. This correlation may be performed by correlating an attenuated version of the test signal against the response signal, whereby the attenuation helps to compensate for loss through the capacitive coupling. As another example, the correlation may be performed by correlating a filtered version of the test signal against the response signal, whereby the attenuation helps to compensate for filtering of the test signal and response signal by the capacitive coupler. As yet another example, correlation may be performed by autocorrelating the response signal which has the test signal superimposed thereon, for example with a single capacitive coupler provides both the injector and extractor.

One benefit of using a reflectometry instrument 16 in embodiments of the present invention is that remote detection of the signal path characteristics is possible. This is in contrast to some wire testing systems which require positioning a probe proximate to a failure to detect the failure. For example, some systems inject a test signal, and require a pickup probe to be moved along the signal path looking for a change in a picked up signal at the point of the failure. In contrast, a reflectometer at the end of a wire can be used to detect anomalies located along the length of the signal path. This can be of considerable advantage where it is difficult to access the signal path, for example, a wire in an aircraft fuselage.

As another alternative, the injection probe 12 and/or extraction probe 14 can also be used for the transmission or reception of other signals as well. For examine, an injection probe can be used to transmit signals into the signal path. Additionally, an extraction probe can be used to receive signals from the signal path.

Figure 12:
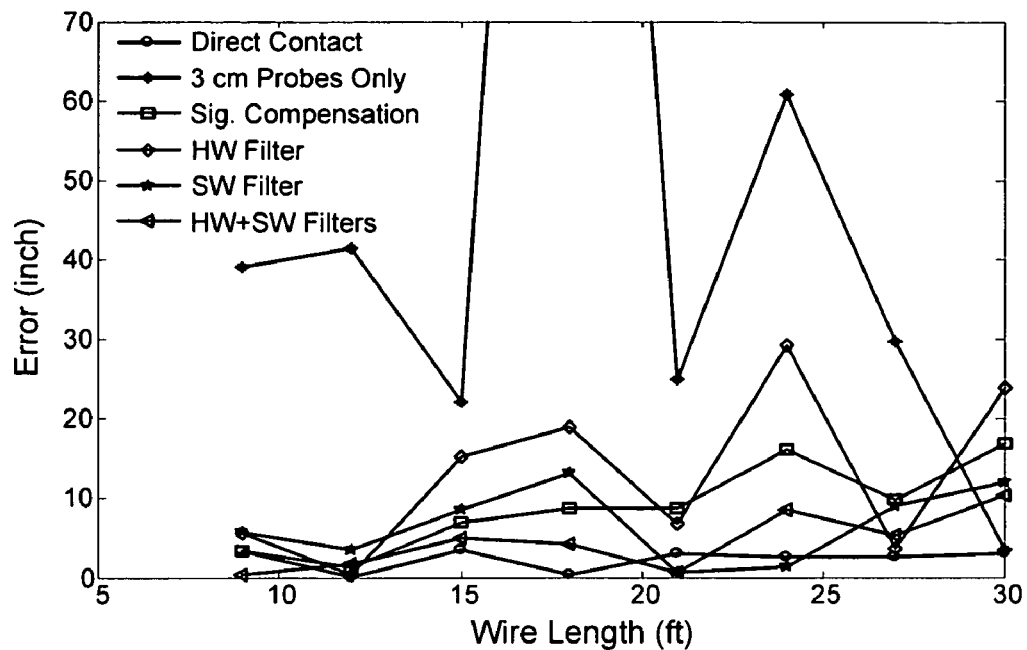
FIG. 12 is a graph showing exemplary wire length measurement errors obtained using various probe configurations in accordance with embodiments of the present invention.
Figure 13:
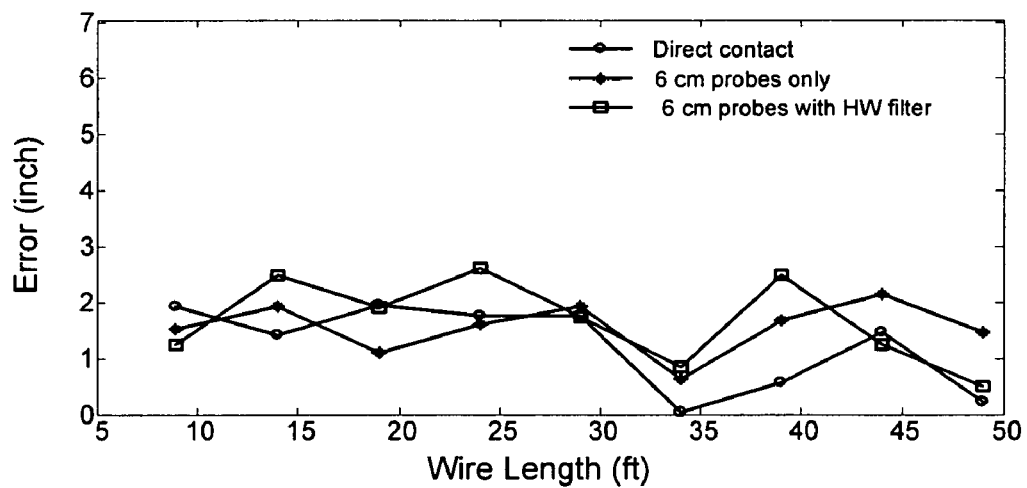
FIG. 13 is another graph showing exemplary wire length measurement errors obtained using various probe configurations in accordance with embodiments of the present invention.

In sum, non-contact reflectometry can provide numerous benefits over prior systems which require making a direct electrical connection to the signal path under test. While the use of capacitive coupling results in signal distortions, these distortions can be compensated for if desired. FIGS. 12 and 13 provide a comparison of testing accuracy using techniques as disclosed herein as compared to a direct contact approach. Exemplary results are shown for non-contact probes having a length of 3 cm in FIG. 12 and for non-contact probes having a length of 6 cm in FIG. 13. It can be seen that useful wire length measurements were obtained over a range of wire lengths. Accuracy can be improved by inclusion of signal compensation (baseline subtraction), hardware low pass filtering, software filtering, and combinations as illustrated. It can be seen that non-contact reflectometry con obtain comparable accuracy as direct contact techniques.

It is to be understood that the herein-described arrangements are only illustrative of the application for the principles of the present invention. Numerous modifications and alternative arrangements can be devised without departing from the spirit and scope of the present invention. While the present invention has been shown in the drawings and described herein with particularity and detail in connection with what is presently deemed to be the most practical and preferred embodiment(s) of the invention, it will be apparent to those of ordinary skill in the art that numerous modifications can be made without departing from the principles and concepts of the invention as set forth herein. Accordingly, it is not intended that the scope of the invention be limited excepted by the claims set forth below.

What is claimed is:

1. A non-contact reflectometry system for testing a signal path comprising:

a) an injection probe comprising a first conductive body shaped to create electrical capacitance between the first conductive body and the signal path when placed in near proximity to the signal path and configured to inject a test signal into the signal path via capacitive coupling to the signal path when placed in near proximity to a first point on the signal path;

b) an extraction probe comprising a second conductive body shaped to create electrical capacitance between the second conductive body and the signal path when placed in near proximity to the signal path and configured to extract a response signal from the signal path via capacitive coupling to the signal path when placed in near proximity to a second point on the signal path; and c) a reflectometry instrument operatively coupled to the injection probe and to the extraction probe and configured to generate the test signal, accept the response signal, and determine a signal path characteristic from the response signal.

2. The system of claim 1, wherein the injection probe and extraction probes are each a capacitive coupler.

3. The system of claim 2, wherein the capacitive coupler comprises a substantially cylindrical conducting body configured for placement substantially surrounding a signal path.

4. The system of claim 3, wherein the cylindrical conducting body is flexible.

5. The system of claim 2, wherein the capacitive coupler comprises a flexible, spiral element configured for wrapping around a signal path.

6. The system of claim 2, wherein the capacitive coupler comprises an extended substantially linear element configured for placement substantially parallel to a signal path.

7. The system of claim 2, wherein the capacitive coupler comprises a clamp element configured to clamp around the signal path.

8. The system of claim 1, wherein the injection probe and the extraction probe are provided by a single capacitive coupler.

9. The system of claim 1, wherein the reflectometry instrument is chosen from the group of instruments consisting of a time domain reflectometer, a frequency domain reflectometer, a standing wave reflectometer, a sequence time domain reflectometer, a spread spectrum reflectometer, a mixed signal reflectometer, and a noise domain reflectometer.

10. The system of claim 1, wherein the signal path characteristic is the location of an anomaly in the signal path.

11. The system of claim 1, further comprising an amplifier coupled between the reflectometry instrument and the injection probe to amplify the test signal before injection into the signal path.

12. The system of claim 1, further comprising an amplifier coupled between the extraction probe and the reflectometry instrument to amplify the response signal after extraction from the signal path.

13. A method of non-contact reflectometry testing of a signal path comprising:
   a) generating a test signal;
   b) capacitively coupling to the signal path by placing a first conductive body in near proximity to the signal path to create capacitive between the first conductive body and the signal path to inject the test signal into the signal path at a first point;
   c) capacitively coupling to the signal path by placing a second conductive body in near proximity to the signal path to create capacitive between the second conductive body and the signal path to extract a response signal from the signal path at a second point; and
   d) determining a characteristic of the signal path from the response signal using reflectometry techniques.

14. The method of claim 13, wherein the first point is located at the beginning of a wire.

15. The method of claim 14, wherein the second point is located at the end of the wire.

16. The method of claim 13, wherein the first point and the second point are substantially collocated.

17. The method of claim 13, wherein the signal path is carrying an operational signal.

18. The method of claim 13, further comprising compensating for frequency response effects caused by capacitively coupling.

19. The method of claim 13, wherein determining a characteristic of the signal path further comprises compensating for known characteristics of the signal path.

20. The method of claim 13, further comprising filtering the response signal.

* * * * *